United States Patent [19]

Thuot

[11] 4,104,578
[45] Aug. 1, 1978

[54] PORTABLE DIGITAL OHMMETER

[75] Inventor: Michael E. Thuot, Espanola, N. Mex.

[73] Assignee: Westinghouse Electric Corp., Pittsburgh, Pa.

[21] Appl. No.: 740,686

[22] Filed: Nov. 10, 1976

[51] Int. Cl.² ............................................. G01R 31/02
[52] U.S. Cl. .................. 324/28 CR; 324/62; 324/64; 324/65 CR; 324/140 R
[58] Field of Search ............... 324/62, 28 CR, 65 R, 324/65 CR, 30 R, 140 R, 140 D, 28 R, 64

[56] References Cited
U.S. PATENT DOCUMENTS

| 2,461,425 | 2/1949 | Kelly | 324/140 D |
| 3,382,430 | 5/1968 | Cunniff | 324/DIG. 1 |

Primary Examiner—M. Tokar
Attorney, Agent, or Firm—M. S. Yatsko

[57] ABSTRACT

A portable ohmmeter for use in measuring the resistance of an electrical contact including a direct current battery, and a resistive element serially connected with the contact and the battery to form a complete circuit. Included are means for sensing the voltage drop across both the resistive element and the contact, and a digital ratiometer for displaying the value of the resistance of the electrical contact. The digital ratiometer displays the ratio of the voltage drop across the contact to the voltage drop across the resistive element, which ratio is also the value of the resistance of the contact. Also included are means for calibrating the ratiometer as a function of the resistance of the resistive element.

10 Claims, 2 Drawing Figures

PORTABLE DIGITAL OHMMETER

BACKGROUND OF THE INVENTION

The present invention relates generally to apparatus for measuring the resistance of a load, and more particularly to apparatus for measuring the resistance of breaker contacts utilized for switching electrical power.

The breaker resistance of contacts for use in switching and distributing electrical power is required to be determined during production of such breaker contacts as well as in the field for preventive maintenance. The measurement of breaker contact resistance must be extremely accurate in order to provide ratings in accordance with existing industry standards. The standards generally require that high voltage power circuit breaker contact resistance be measured by applying 100 amps across the circuit breaker terminals. The measurements required by the standards have presented problems in that there has not been available a lightweight, portable battery-operated unit which has been able to supply the necessary amperage with consistently good accuracy. Prior art methods have used very high current power sources, such as direct current welders, and have used measuring methods with limited accuracy such as millivolt meters. The weight of these units is extremely heavy, and therefore these units have been stationary in nature. Accordingly, they are limited to production testing and not very useful in the field.

Another method utilized in the prior art was that as exemplified by the U.S. Patent to Alber et al, Pat. No. 3,816,812. This measuring apparatus has not proven entirely satisfactory, in that the apparatus described therein is not utilized to determine resistances in the micro-ohm range; rather, the measuring apparatus therein is constructed to be a millivolt tester.

SUMMARY OF THE INVENTION

The aforementioned problems of the prior art are eliminated by this invention by providing a portable ohm-meter useful in measuring the resistance of an electrically conducting member in which resistances can be determined in the micro-ohm range. The ohmmeter comprises a direct current power source and a resistive element serially connected to the power source. The resistive element and the power source are serially connected to the electrically conducting member, and also included are means for sensing the voltage drop across both the resistive element and the conducting member. A digital ratiometer has inputs connected to both sensing means, and the ratiometer compares the voltage drop across the conducting member to the voltage drop across the resistive element. The digital ratiometer digitally displays the resulting ratio, which is the resistivity of the electrically conducting member. Also included are means for calibrating the ratiometer as a function of the resistance of the resistive element.

BRIEF DESCRIPTION OF THE DRAWINGS

Reference is now made to the description of the preferred embodiment, illustrated in the accompanying drawings, in which.

DESCRIPTION OF THE PREFERRED EMBODIMENT

Figure 1:
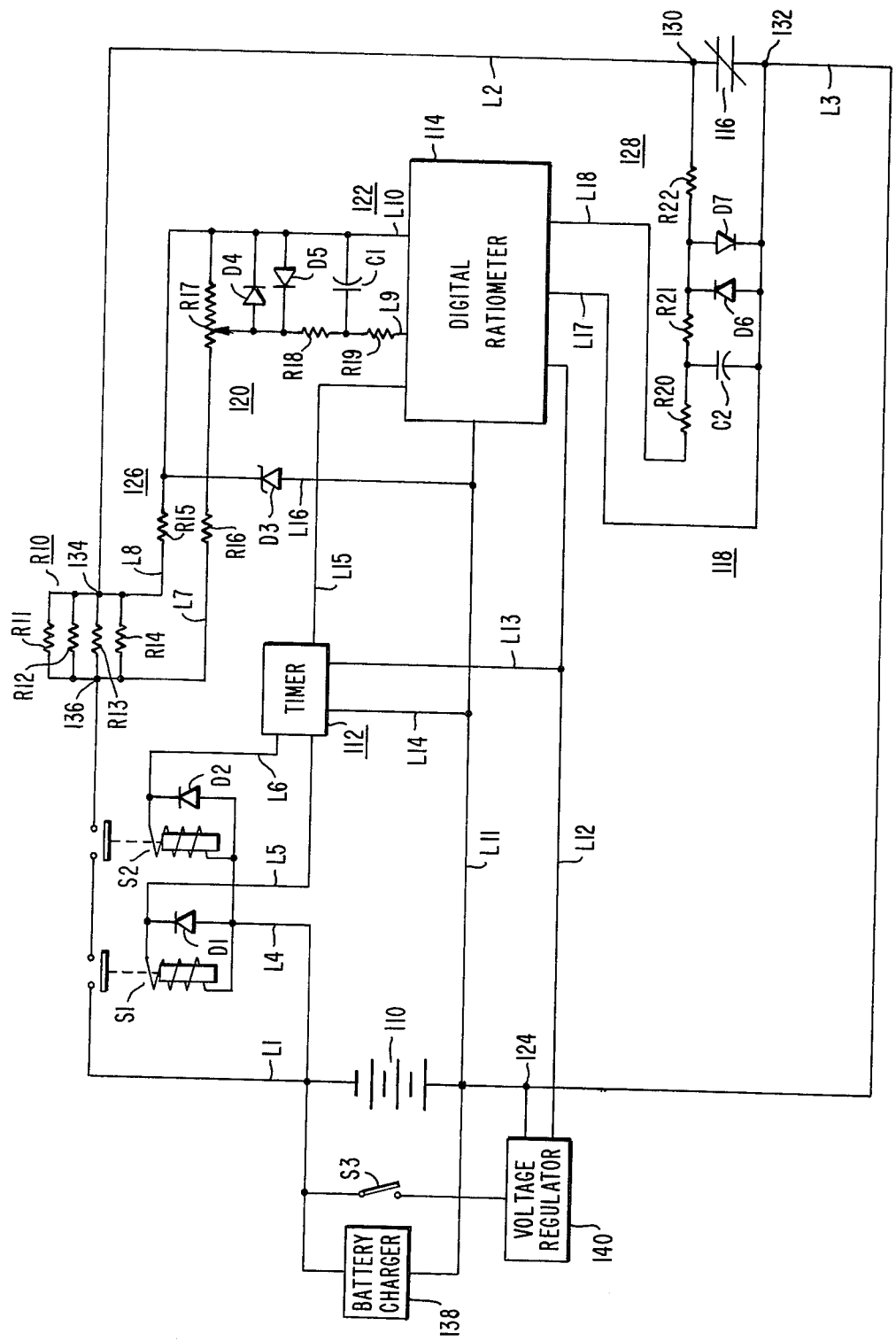
FIG. 1 is an electrical schematic of the ohmmeter of this invention.

Referring now more particularly to FIG. 1, there is shown a direct current power source 110, which is a 12-volt nickel cadmium battery, which is serially connected to a resistive element R10 through line L1. The resistive element R10 is comprised of a plurality of individual resistors R11, R12, R13 and R14, which are parallelly connected. The resistive element R10 is serially connected to the electrically conducting member 116 whose resistance is desired to be measured, through the line L2. The electrically conducting member 116 illustrated in the schematic is, for example, an electrical contact within a circuit breaker. Completing the circuit, the conducting member 116 is serially connected to the opposite side of the power source 110 through the line L3.

To accurately measure the conducting member 116 resistance, it is desirable that the resistive element R10 have a resistance greater than the expected resistance of the conducting member 116. Preferably, this resistive element R10 should have a resistance at least 50 times greater than the conducting member 116 resistance. For measurements within the micro-ohm range, it has been found that 12 1-ohm resistors parallelly connected to form the resistive element R10 is satisfactory.

Also included within the line L1 are two switches S1 and S2. The purposes of the switches S1, S2 is to turn the circuit on and off; that is, the switches S1 and S2 will permit current to flow from the power source 110 to the conducting member 116, and will, at other times, prevent such current from flowing. Also included within the ohmmeter illustrated are sensing means 126 for sensing the voltage drop across the resistive element R10, sensing means 128 for sensing the voltage drop across the conducting member 116, and a digital ratiometer 114. Also shown is a timer 112, battery charger 138, and voltage regulator 140, whose functions will hereinafter be explained.

The resistance element sensing means 126 is comprised of two lines L7 and L8 which are connected at nodes 136 and 134 respectively on opposite sides of the resistive element R10. The line R7 includes resistor R16, and line L8 includes resistor R15. The sensing means 126 also include the calibration means 120 and filtering means 122. The filtering means 122 are utilized to suppress any transients which may be occurring within the sensing means due to instantaneous current flowing through the resistive element R10. The filtering means 122 are comprised of diodes D4 and D5, resistors R18 and R19, and capacitor C1. The calibration means 120 is comprised of the voltage tap of line L9 and the resistor R17. Line L9, which senses the voltage from line 7 as modified by the resistor R16 and the variable resistor R17, and line L10, which senses the voltage on line L8, are inputs into the digital ratiometer 114. The pair of lines L9 and L10 input into the digital ratiometer 114 the calibrated voltage drop across the resistive element R10.

The conducting member sensing means 128 is comprised of lines L17 and L18 which, at one end thereof, are inputs into the digital ratiometer 114, and at the other end are connected to nodes 130 and 132 on opposing sides of the conductive member 116. Lines 17 and 18 measure the voltage drop across the conductive member 116. Also included within the sensing means 128 are the filtering means 118 which, like the filtering means 122 heretofore described in relationship to the resistive element sensing means 126, are utilized for suppressing transients, is comprised of diodes D6 and D7, resistors R20, R21, and R22, and capacitor C2.

The digital ratiometer 114 is an instrument which compares two voltage inputs and displays digitally the ratio therebetween. The ratiometer 114 also includes a trigger input, which causes the ratio to be displayed on the digital output, a power input for powering the display mode, and a grounding node which maintains the displayed digits for as long as the ratiometer ground input is grounded. For the ratiometer illustrated in FIG. 1, the power input is connected to line L12, the grounding input is line L11, and the trigger, or sample and hold input, is connected to line L15. The digital ratiometer is a commercially available instrument well known to those skilled in the art, and, for example, is of the type sold commercially by the Meterex Corporation as Model No. BRM2000.

The digital ratiometer 114, and the timer 112, are powered by a voltage output from a voltage regulator 140. The voltage regulator 140 has two inputs; one through the switch S3 to the battery positive terminal 110, and one to the battery ground node 124. The output of the voltage regulator 140 is through line L12, which, typically, supplies 5 volts DC to the timer 112 and ratiometer 114. To minimize the expense of utilizing the ohmmeter, the battery 110 is connected to a battery charger 138 which may then, for example, be connected to a standard outlet (not shown). Thus, when the battery 110 is not being used, it can be renewed and recharged by the battery charger 138.

To protect the ratiometer 114 from an overvoltage loading in case the conducting element 116 is not connected to lines L2 and L3 whenever switches S1 and S2 are activated, a Zener diode D3 is installed in a line L16 between line L8 and line L11. In this location, the Zener diode D3 acts as a voltage limiter on line L10.

The timer 112 is comprised of three No. NE555 timing chips 142, 144, 146 and associated circuitry to provide timing constants. See FIG. 2. The timer 112 has inputs L13 and L14. Line L13 supplies 5 volt power to the timing chips 142, 144 and 146, and line L14 connects to ground. The outputs of the timer 112 are lines L6, L5 and L15. Line L5 connects the timer 112 to the switch S1, the line L6 connects the timer 112 to switch S2, and the line L15 connects the timer 112 to the digital ratiometer 114, and more particularly to the sample and hold input of the digital ratiometer 114.

Included within the circuitry for the timer 112 is the switch S4, resistors R23, R24, R29, and capacitors C4 and C5. The timing chip 142 is associated with variable resistor R27 and capacitor C8. The variable resistor R27 enables the timing chip 142 to have a range of time delay during which the switch S1 is closed and transistor T1 is turned on. The timer 144 has associated with it resistor R26 and capacitor C7, with the variable resistor R26 enabling the chip 144 to have a variable time delay which may be set. Likewise, timing chip 146 has variable resistor R25 and capacitor C6 associated therewith to provide a time constant which may be varied by adjusting the variable resistor R25. In this manner, all three timing chips 142, 144, and 146 may be set independently of each other to provide differing time delays before activating their associated outputs L6, L5 and L15 respectively.

The timing chip 142 has an output connected through resistor R30 to transistor T1. The timer 144 has an output connected through resistor R31 to transistor T2. The function of the two transistors is to maintain the switches S1 and S2 to which they are connected in a spaced apart relationship from the line L1 so as to prevent the flow of current from the battery 110 to the conducting member 116 until such time as it is desired to activate the circuit. The timing chip 146 has its output connected to capacitor C12, inverters I1 and I2, and resistor R32 parallelly connected with the inverters I1 and I2. This output is then directed through line L15 to the sample and hold input of the digital ratiometer 114, and when activated will send a trigger pulse to the ratiometer 114 to enable it to display the resistance measurement across conducting member 116.

Figure 2:
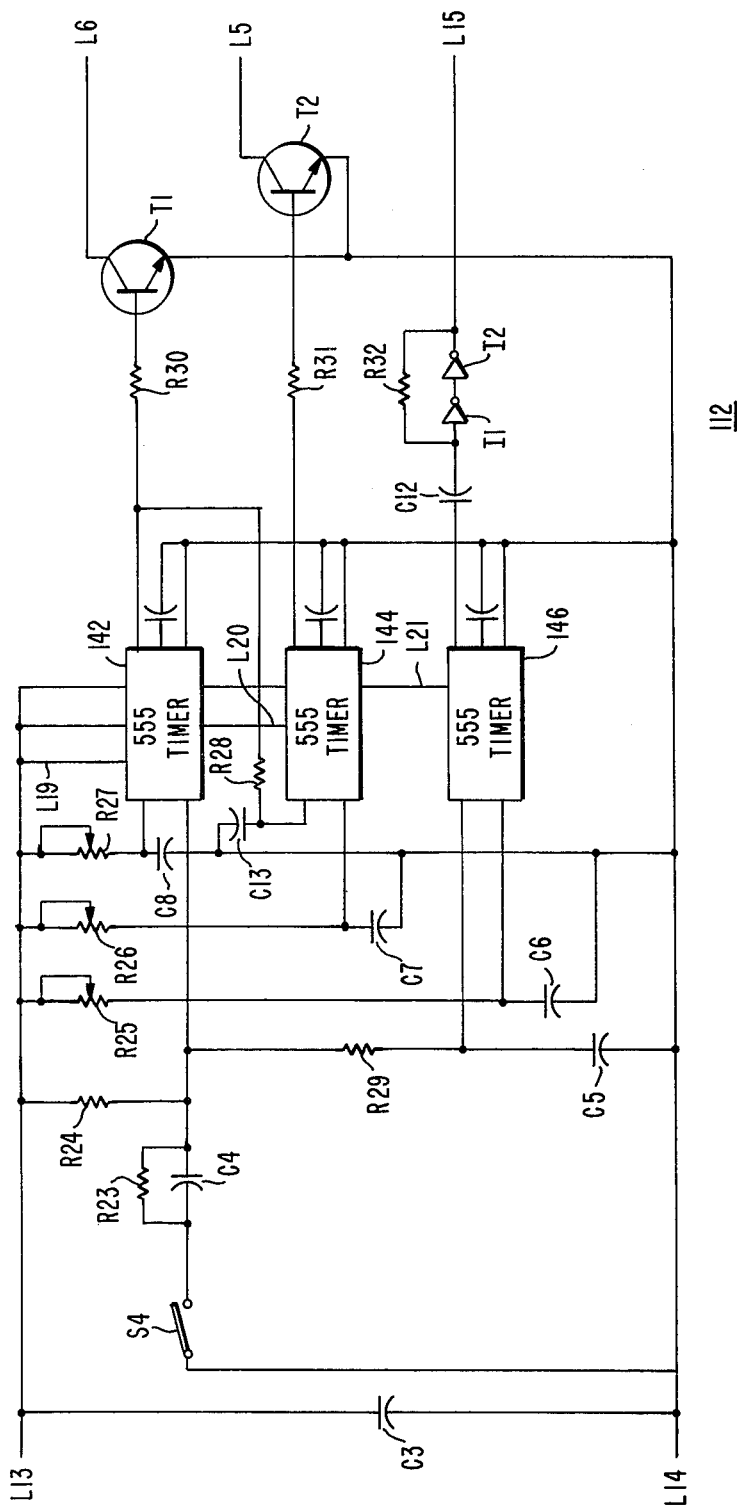
FIG. 2 is an electrical schematic of the timing means used in FIG. 1.

The operation of the portable ohmmeter is substantially as follows, taken in conjunction with FIGS. 1 and 2. Switches S1 and S2 are in a spaced apart relationship from line L1, so as to prevent any flow of current through line L1. Lines L2 and L3 are connected to nodes 130 and 132 respectively on opposite sides of the conducting member 116 whose resistance is desired to measure. Switch S3 is then moved to complete a circuit and enable power to flow from battery 110 to the voltage regulator 140. The voltage regulator then supplies power to the digital ratiometer 114 through line L12, and to the timer 112 through line L13. At this time, switch S4 is depressed to complete the circuit in which it is located, and to begin the timer 112 operation. Transistor T1 is turned on immediately by actuation of switch S4, and remains on for a time set by resistor R27 and capacitor C8. When transistor T1 is activated, a short time delay is generated by resistor R28 and capacitor C13, which than, through timer 144, turns on transistor T2. This transistor T2 remains on for the time delay set by resistor R26 and capacitor C7. Upon being turned on, transistors T1 and T2 present a short to ground, thereby causing the voltage supplied by the battery 110 through line L4 to be dissipated across switches S1 and S2. This causes the switches S1 and S2 to move into contact with line L1, thereby enabling current to flow from battery 110 through line L1 to the resistive element R10 and conducting member 116. As current flows through the resistive element R10 and conducting member 116, the sensing means 126 and 128 sense the voltage drops across the resistive element R10 and conducting member R16 respectively. The sensing means 126 then supplies this voltage drop through lines L9 and L10 to the ratiometer 144. The sensing means 128 supplies the voltage it senses through lines L17 and L18 to the ratiometer 114. The ratiometer compares the two voltage drops and determines the ratio between the voltage drop across the conducting member 116 to the voltage drop across the resistance element R10. However, this determined ratio is not displayed yet.

The actuation of switch S4 also turns on timing chip 146, following a short delay generated by resistor R29 and capacitor C5. The timing chip 146, after a time delay as determined by resistor R25 and C6, will supply an output to line L15. This time delay associated with timing chip 146 should be of a time sufficient to enable to enable any transients across the resistive element R10 and conducting member 116 caused by the initiation of current flow through lines L1, L2 and L3 to dampen. After such time delay, the timing chip 146 sends a signal through line L15 to the digital ratiometer 114. This signal in line L15 causes the ratiometer to sample and hold the ratio between the voltages across the conducting member 116 and the resistive element R10. This ratio will then be displayed, and held on display, because of the grounding by L11 of the display input of the ratiometer 114. Then, the operator can read directly the value of the resistance across the conducting member 116 directly from the display of the digital ratiometer.

The calibration of the ohmmeter is accomplished by utilizing the calibraiton means 120 and more specifically the variable resistor R17. Instead of utilizing the conducting member 116 within the circuit, a known resistance (not shown) such as may be obtained from the U.S. Bureau of Standards and having its resistance precisely measured, is inserted between the two nodes 130 and 132. The switches S3 and S4 are then depressed, and the ohmmeter will display a value, as heretofore described. The calibration then occurs by varying the resistor R17 until such time as the ratiometer 114 displays the value of resistance equal to the known resistance of the standard. Once this resistor has been set to display the resistance, the standard is removed from between nodes 130 and 132 and the ohmmeter is now calibrated for use in determining unknown resistances. Additionally, since the calibration is relatively simple to undertake, the ohmmeter can be calibrated at regular, frequent intervals to provide for a high degree of accurancy.

As an example of a circuit which has been found to operate satisfactorily, the following resistances and capacitances were used as the appropriate resistors as found on the following table:

| R10 | - | .08Ω | R23 | - | 500KΩ |
| R15 | - | 10Ω | R24 | - | 470Ω |
| R16 | - | 10KΩ | R25 | - | 50KΩ |
| R17 | - | 500Ω | R26 | - | 50KΩ |
| R18 | - | 24KΩ | R27 | - | 50KΩ |
| R19 | - | 24KΩ | R28 | - | 2.2KΩ |
| R20 | - | 24KΩ | R29 | - | 2.2KΩ |
| R21 | - | 24KΩ | R30 | - | 510Ω |
| R22 | - | 50Ω | R31 | - | 510Ω |
|  |  |  | R32 | - | 5.6KΩ |
| C1 | - | 1μf | C5 | - | .1μf |
| C2 | - | 1μf | C6 | - | 50μf |
| C3 | - | 100μf | C7 | - | 50μf |
|  |  |  | C8 | - | 50μf |
| C4 | - | 22μf | C12 | - | .0068μf |
|  |  |  | C13 | - | .1μf |

Therefore, it can be seen that the invention herein described provides a portable ohmmeter which is useful in measuring the resistance of an electrically conducting member, and which is especially useful for measuring resistances of the micro-ohm range.

I claim as my invention:

1. A portable ohmmeter useful in measuring the resistance of an electrically conducting member comprising:
    a direct current power source;
    a resistive element serially connected to said power source, said resistive element having a resistance greater than the resistance of said conducting member to be measured;
    means for connecting said conducting member in series with said power source and said resistive element to thereby complete a circuit;
    means for sensing the voltage drop across said resistive element;
    means for sensing the voltage drop across said conducting member;
    a digital ratiometer having inputs connected to said conducting member sensing means and said resistive element sensing means, said ratiometer comparing said conductive member voltage drop to said resistive element voltage drop, said ratiometer digitally displaying the ratio of said conducting member voltage drop to said resistive element voltage drop; and
    calibration means for calibrating said ratiometer as a function of the resistance of said resistive element.

2. The ohmmeter according to claim 1 wherein said power source is a nickel cadmium battery.

3. The ohmmeter according to claim 1 including timing means connected to said ratiometer for suppressing the display of said ratio for a time sufficient for any current transients within said circuit to dampen.

4. The ohmmeter according to claim 1 including switching means serially connected in said circuit for permitting current to flow from said power source through said resistive element and said conducting member, said switching means capable of prohibiting the flow of current from said power source to said conducting member.

5. The ohmmeter according to claim 1 wherein said resistive element has a resistance at least 50 times greater than the resistance of said conducting member to be measured.

6. The ohmmeter according to claim 1 including a voltage regulator for supplying power to operate said ratiometer.

7. The ohmmeter according to claim 6 wherein said voltage regulator is connected to, and powered by said power source.

8. The ohmmeter according to claim 1 wherein said resistive element comprises a plurality of parallelly connected resistors.

9. The ohmmeter according to claim 1 including first filtering means connected to said conducting member sensing means for suppressing any transient voltage drops sensed by said conducting member sensing means; and
    second filtering means connected to said resistive element sensing means for suppressing any transient voltage drop sensed by said resistive element sensing means.

10. The ohmmeter according to claim 1 wherein said electrically conducting member is a closed electrical contact.

* * * * *